(12) United States Patent
Kaeslin et al.

(10) Patent No.: US 7,710,192 B2
(45) Date of Patent: May 4, 2010

(54) LOW-VOLTAGE IC-CIRCUIT

(75) Inventors: Hubert Kaeslin, Schwerzenbach (CH); Norbert Felber, Zurich (CH)

(73) Assignee: Bernafon AG, Berne (CH)

( * ) Notice: Subject to any disclaimer, the term of this patent is extended or adjusted under 35 U.S.C. 154(b) by 718 days.

(21) Appl. No.: 10/554,634

(22) PCT Filed: Apr. 27, 2004

(86) PCT No.: PCT/EP2004/004433

§ 371 (c)(1),
(2), (4) Date: Mar. 16, 2007

(87) PCT Pub. No.: WO2004/098016

PCT Pub. Date: Nov. 11, 2004

(65) Prior Publication Data

US 2007/0253235 A1    Nov. 1, 2007

(30) Foreign Application Priority Data

Apr. 30, 2003  (EP) .................................. 03388028

(51) Int. Cl.
*G05F 3/02* (2006.01)
*H02J 1/10* (2006.01)

(52) U.S. Cl. ..................... 327/535; 307/20; 307/36; 307/60; 327/564

(58) Field of Classification Search ................. 323/267; 327/534, 535, 538, 540, 541, 543, 564; 307/11, 307/12, 18, 19, 20, 36, 60, 61, 63, 69, 77
See application file for complete search history.

(56) References Cited

U.S. PATENT DOCUMENTS

| | | | |
|---|---|---|---|
| 5,781,001 A * | 7/1998 | Takemoto | .................... 323/267 |
| 6,121,751 A | 9/2000 | Merritt | |
| 7,329,968 B2 * | 2/2008 | Shepard et al. | ................ 307/18 |
| 2002/0084824 A1 | 7/2002 | Cohn et al. | |

* cited by examiner

*Primary Examiner*—Gary L Laxton
(74) *Attorney, Agent, or Firm*—Birch, Stewart, Kolasch & Birch, LLP

(57) ABSTRACT

An integrated circuit is partitioned into two or more sub-circuits, each sub-circuit including two supply terminals across which to receive supply voltage. The sub-circuits are connected in series with the first sub-circuit receiving input voltage at its first supply terminal, and the voltage level output at the second supply terminal of the first sub-circuit being used as input voltage level in a second sub-circuit. Further, a control-circuit is configured to balance voltage drops across the sub-circuits and to maintain constant voltage-drops over the sub-circuits. The control-circuit includes two buffer capacitors, each coupled in parallel over one of the two sub-circuits respectively. The control-circuit also includes at least one bucket capacitor alternately coupled in parallel over the first and the second buffer capacitor through a switching system controlled by a toggling signal.

6 Claims, 3 Drawing Sheets

LOW-VOLTAGE IC-CIRCUIT

BACKGROUND OF THE INVENTION

Starting with the 0.35 μm generation, CMOS scaling has changed from a constant-voltage regime with a nominal supply voltage of 5V to a constant-field regime where the supply voltage is being reduced in concert with geometric dimensions with each process generation. We are thus likely to see more and more CMOS circuits in the future that must operate with a supply voltage below that of the usual sources of electrical energy. As an example, consider a 1.2V battery cell that feeds a low-power low-voltage circuit operating at a mere 0.6V. The most obvious solution is to use a voltage converter in down mode. While this is possible, the converter is costly, space consuming, and also has its own power dissipation. Partitioning the overall IC into two or more sub-circuits and connecting them in series does away with the down converter because the IC can so be powered from a supply with a higher voltage than what is suitable for an individual sub-circuit. U.S. Pat. No. 6,479,974 further proposes to adjust the voltages across the various sub-circuits with the aid of controllable current sources that bleed off excess voltage. The invention improves on the energy-efficiency and on the simplicity of series-connected power schemes by doing the voltage balancing with capacitor switching instead.

According to U.S. Pat. No. 6,479,974, the circuit on the IC is partitioned into power-consuming sub-circuits each of which is to be fed with its own supply voltage and the sub-circuits are then connected in series. This effectively cuts the supply voltage for each sub-circuit. In this way it becomes possible to use a battery cell with a high voltage to feed a low voltage circuit without the need to provide the usual down converter. As voltage drops across the individual sub-circuits will tend to distribute unevenly because current drains in the various workload sub-circuits are never quite the same, U.S. Pat. No. 6,479,974 proposes to compensate for this undesirable effect by connecting a regulator in parallel with each sub-circuit. A controlled current source in each regulator adjusts its current drain such as to maintain a fixed voltage across its own terminals and, hence, across the power-consuming sub-circuit as well. An extra central unit is utilized to coordinate the various regulators such that at least one of them draws zero current thereby minimizing the collective current drain from the power supply.

An alternative embodiment of U.S. Pat. No. 6,479,974 proposes to adjust switching activities in the workload sub-circuits at run time such as to balance their supply currents and, hence, also the voltage drops across them. The patent even suggests the duplication of logic circuitry to provide for sufficient headroom for activity adjustments.

SUMMARY OF THE INVENTION

Yet, however much care is taken in the prior art technique, it cannot be ensured that the subcircuit's respective current drains always match. Any imbalance implies that power is being wasted for nothing. This is because an imbalance either causes one or more of the regulators to carry a nonzero current or gives rise to redundant switching activities.

The invention aims at energy saving in a power supply for an IC partitioned into two or more sub-circuits connected in series.

This is achieved with an IC-circuit construction where the circuit is partitioned into power consuming sub-circuits which each has to receive a supply voltage, and where the sub-circuits are connected in series and where a control-circuit is provided in order to balance the voltage drops across the power consuming sub-circuits whereby constant voltage-drops over the sub-circuits are maintained, and where ground voltage level in the power supply of a first sub-circuit is used as the supply voltage level in a second sub-circuit. According to the invention the control circuit comprises a first buffer capacitor coupled in parallel over the supply voltage level and ground voltage level of the first sub-circuit and a second buffer capacitor coupled in parallel over the supply voltage level and the ground voltage level of the second sub-circuit, whereby means for maintaining a uniform voltage drop over the first and the second buffer capacitor comprises at least one bucket capacitor which is alternately coupled in parallel over the first and the second buffer capacitor through a switching system controlled by a toggling signal.

In this way it becomes possible to drive the sub-circuits with very little energy loss, and further this allows balanced voltages to be obtained with no control loops and without complicated activity monitoring and/or adjusting mechanisms in the means for maintaining a uniform voltage drop. The provision of the buffer capacitors will help to stabilize the voltage over the two sub-circuits by absorbing fast transients in the current consumption. The alternately coupled bucket capacitor is a very simple and elegant way of maintaining a uniform voltage drop over the two buffer capacitors and, hence, also the two sub-circuits. Also this solution recycles excess energy and is thus an energy-efficient way of balancing the voltage drops across the two power-consuming workload sub-circuits. In fact, losses would be almost zero were it not for voltage drops across the transistors that act as switches.

In an alternative embodiment of the invention, there are two bucket capacitors that get switched at the same time such as to alternately couple to the first and the second buffer capacitor respectively. This solution is somewhat more complicated than the solution with only one bucket capacitor, but on the other hand it will assure an even smaller ripple in the supply voltages to the two sub-circuits.

Preferably the switches for alternately coupling the bucket capacitors are controlled by a free-running oscillator, a clock, or some other suitable signal that toggles at a sufficient rate to allow for a near-perfect voltage balance. Having the switching occur in an autonomous manner is sufficient because of the self-regulatory function of the stabilizer circuit and is a great advantage over more complex schemes that involve control loops. The simplicity keeps the necessary circuit overhead down and should make it possible to design cheaper IC units.

In an embodiment of the invention, the midpoint stabilizer is designed such as to deliberately maintain different voltage drops across the sub-circuits. The IC circuits may be digital, analog or mixed signal circuits.

Further various sub-circuits may be located on the same chip or on each their chip according to the particular task at hand.

Three or more sub-circuits can be powered in series with one or more bucket capacitors being switched around to balance the voltages across them.

DESCRIPTION OF A PREFERRED EMBODIMENT

Figure 1:
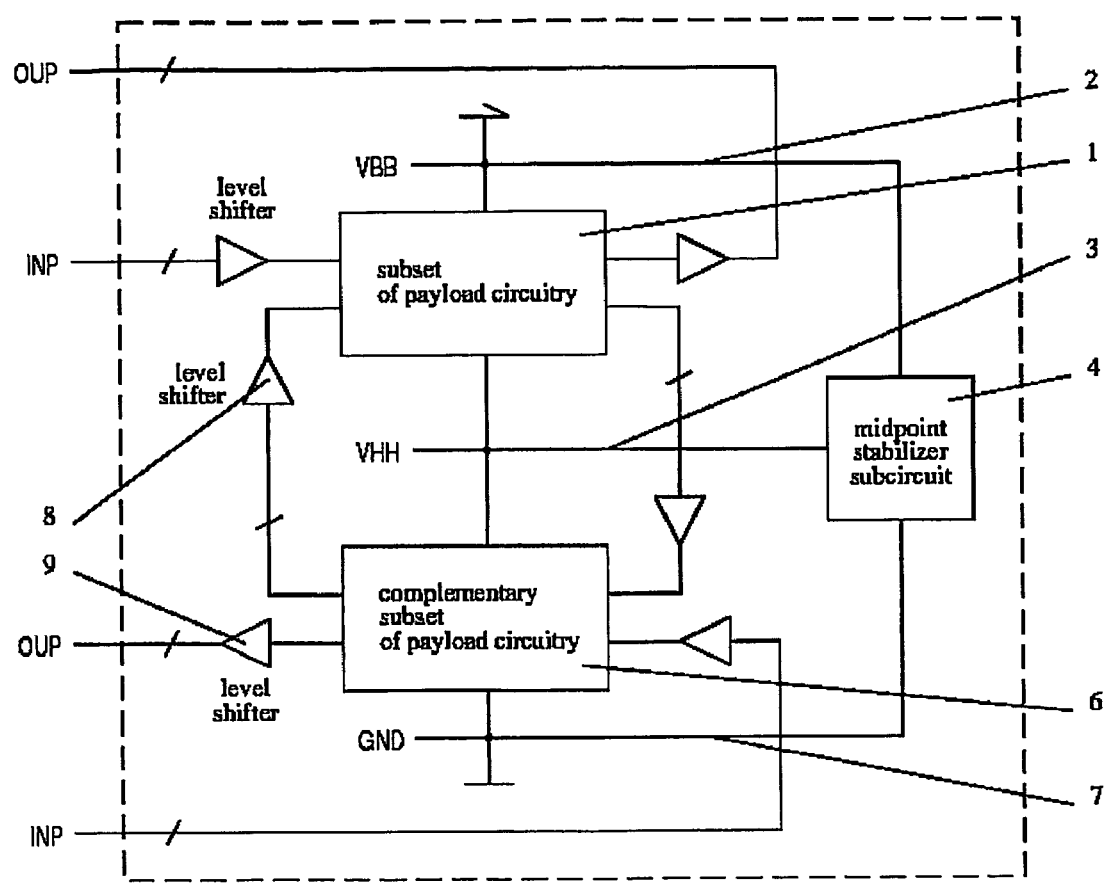
FIG. 1 is an overall circuit arrangement according to the invention.

The overall circuit organization is shown in FIG. 1. Here two complementary subsets of the payload circuit are connected in series. The first sub-circuit 1 of the payload circuitry has a power supply line 2, which maintains the voltage level of VBB and a ground connection 3, which is to maintain voltage level VHH. The ground connection 3 is also routed to the midpoint stabilizer 4 and functions as power supply line to the further sub-circuit 6 of the payload circuitry. This sub-circuit 6 further has a ground connection 7 with the voltage level of GND. The midpoint stabilizer 4 ensures that the voltage in the power supply line 3 that connects sub-circuit 1 to sub-circuit 6 remains constant and at the midpoint between the battery supply voltage VBB and the ground level GND. Level shifters 8 are mandatory wherever a signal crosses over from the lower partition to the upper partition or vice versa. Depending on the peripheral voltage levels, level-shifters 9 are likely to be required on input and output signals as well.

Balancing the voltage drops across the two sub-circuits 1,6 in FIG. 1 of the payload circuit requires that they exhibit identical current drains and activity profiles. Of course, one will strive to obtain a good balance during the design process, yet matching the two sub-circuits statically does not suffice because supply currents inevitably vary over time. Buffer capacitors help to absorb brief current surges. The residual disparities are compensated for by a midpoint stabilizer circuit 4. Two alternative circuits are proposed according to FIGS. 2 and 3 and explained in the following.

Figure 2:
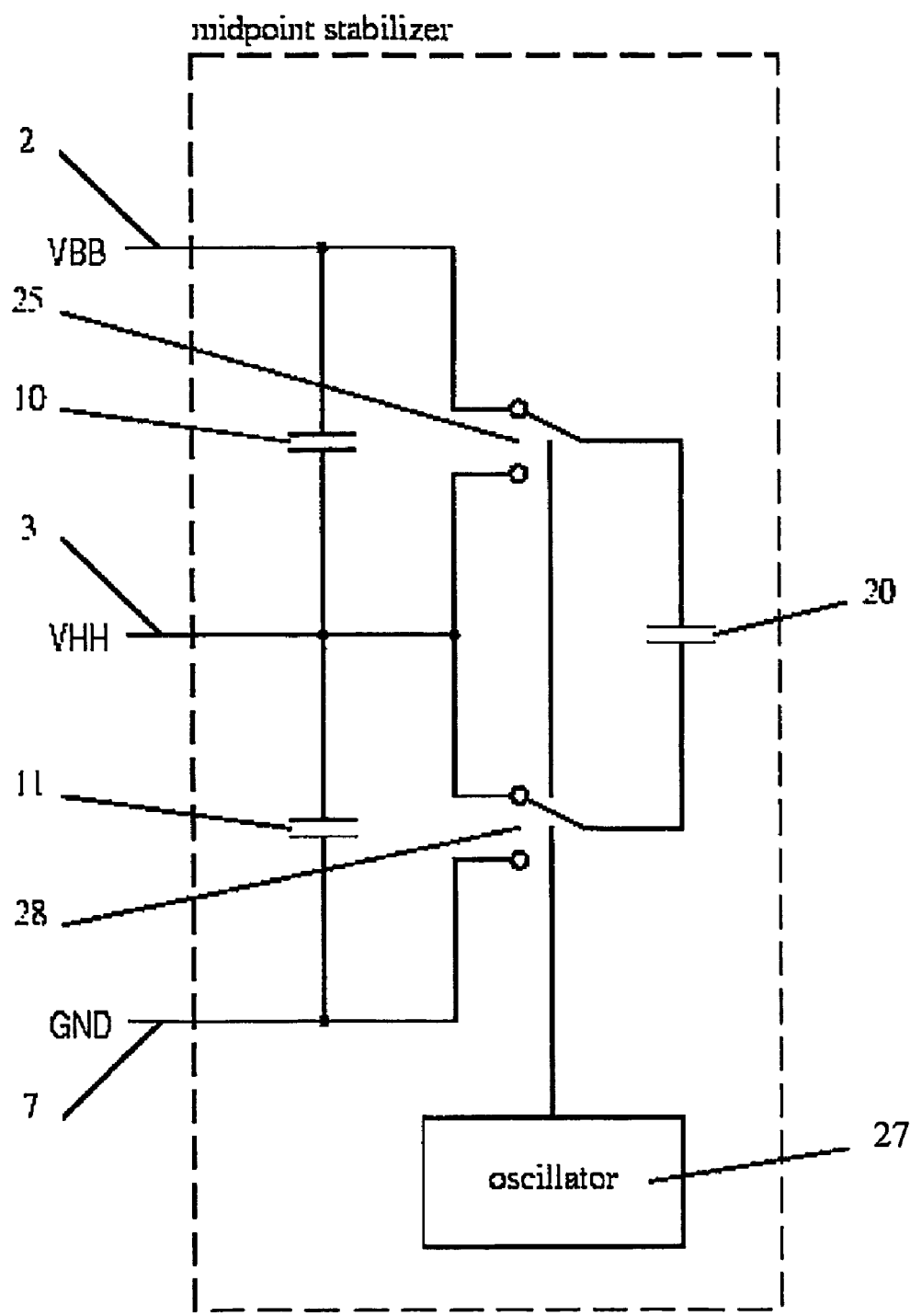
FIGS. 2 and 3 are different embodiments of the midpoint stabilizers.
Figure 3:
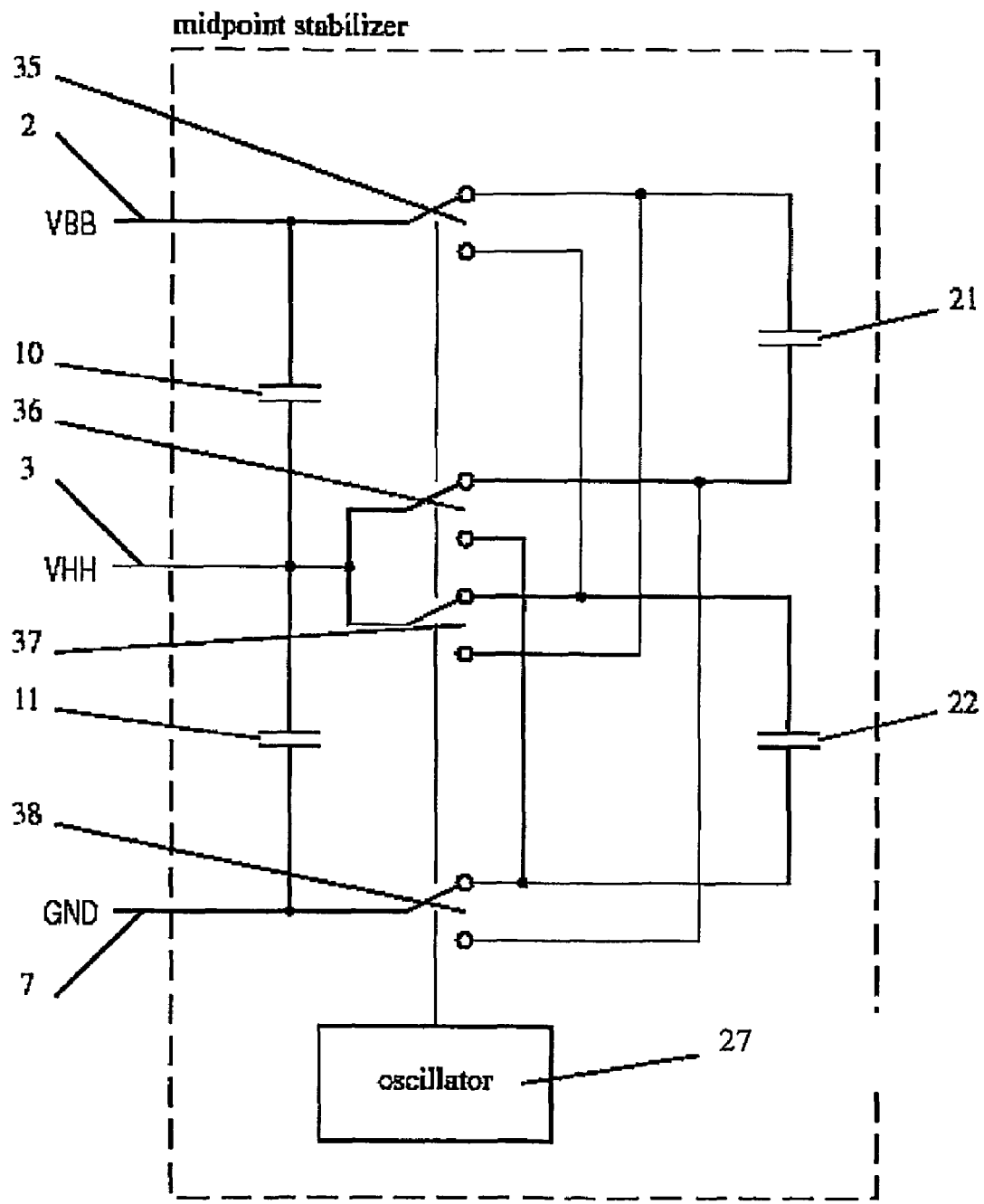

Each of FIG. 2 or 3 fits into FIG. 1 as midpoint stabilizer circuit 4 and connects by way of common circuit nodes including the three voltage levels VBB, VHH and GND through lines 2,3 and 7 respectively. All implementations share the goal of making the voltages across the two payload circuits 1 and 6 in FIG. 1 the same.

The circuits of FIGS. 2 and 3 include no dissipative shunts in their circuits as is otherwise known from the prior art. Instead, they feature extra capacitors that act as buckets for charge transfer. FIG. 2 includes one such bucket capacitor 20 that gets rapidly switched back and forth between the upper and lower payload circuit as the two-throw switches 25 and 28 alternate between their two stable positions. The bucket capacitor 20 accepts extra charge at the higher of the two voltages (VBB-VHH and VHH-GND) and releases that charge at the lower voltage thereby compensating for any momentary difference in the current drains of the two payload circuits. FIG. 3 is more sophisticated in that it includes two such bucket capacitors 21 and 22 and four switches 35, 36, 37 and 38. The advantage is that one can obtain the same low supply voltage ripple with smaller buffer capacitors because one of the buckets picks up charge at the higher voltage while the other one releases charge at the lower level at any time. Again, switches 25 and 28 in FIGS. 2 and 35, 36, 37 and 38 in FIG. 3 may or may not be implemented with the aid of transistors (field-effect transistor FET or bipolar junction transistor BJT, switches in micromechanical technologies, or any other electrically controlled devices).

A point that deserves special attention is the fact that all switches in FIGS. 2 and 3 can be controlled by a free-running oscillator 27, a clock, or some other signal that toggles frequently enough. There is no need to sense and compare the supply voltages across the payload circuits as the rapid switching of the bucket capacitors will naturally tend to make them equal, provided there is no excessive disparity in the respective current consumptions of the two payload circuits.

Proposals in FIGS. 2 and 3 are particularly attractive because they do not make use of any dissipative shunts but recycle excess energy with the aid of capacitors that get switched from the lower partition to the upper one and back again. Also they function in a self-regulating way as there is no need to steer the switching of those charge buckets except, possibly, for avoiding unnecessary switching activity. Though inferior in terms of performance to FIG. 3, the solution presented in FIG. 2 may be a reasonable compromise between energy efficiency, supply ripple and circuit overhead (i.e. cost) in some situations.

The invention claimed is:

1. An IC-circuit construction, comprising:
a circuit partitioned into multiple power consuming sub-circuits, the sub-circuits including a first and a second power supply terminal to receive supply voltage, the sub-circuits connected in series, a first sub-circuit receiving a first input voltage level at its first power supply terminal, and a second voltage level output at the second power supply terminal of the first sub-circuit being used as input voltage level in a second sub-circuit; and
a control-circuit configured to balance voltage drops across the power consuming sub-circuits to maintain constant voltage-drops over the power consuming sub-circuits, the control-circuit including
a first buffer capacitor coupled in parallel over the first power supply terminal and the second power supply terminal of the first sub-circuit,
a second buffer capacitor coupled in parallel over the first power supply terminal and the second power supply terminal of the second sub-circuit, and
at least one bucket capacitor alternately coupled in parallel over the first and the second buffer capacitor through a switching system controlled by a toggling signal.

2. The IC-circuit construction as claimed in claim 1, wherein the control circuit includes:
two bucket capacitors that get switched at the same time to alternately couple to the first and the second buffer capacitor respectively.

3. The IC-circuit construction as claimed in claim 1 or 2, wherein the switching system is controlled by one of a free-running oscillator and a clock.

4. The IC-circuit construction as claimed in claim 1, wherein the power consuming sub-circuits are digital or analog or mixed signal circuits.

5. The IC-circuit construction as claimed in claim 1, wherein each of the power consuming sub-circuits is located on its respective chip.

6. The IC-circuit construction as claimed in claim 1, wherein the control-circuit is configured to maintain different voltage drops across the multiple power consuming sub-circuits.

* * * * *